United States Patent [19]
Litwin et al.

[11] Patent Number: 5,147,209
[45] Date of Patent: Sep. 15, 1992

[54] INTERMEDIARY ADAPTER-CONNECTOR

[75] Inventors: Stanley M. Litwin, San Jose; Jeffrey L. Davis, San Carlos; Michael S. Scott, San Jose, all of Calif.

[73] Assignee: McKenzie Socket Technology, Inc., Fremont, Calif.

[21] Appl. No.: 798,032

[22] Filed: Nov. 20, 1991

Related U.S. Application Data

[63] Continuation of Ser. No. 511,439, Apr. 16, 1990, abandoned.

[51] Int. Cl.$^5$ .............................................. H01R 9/09
[52] U.S. Cl. ...................................... 439/70; 439/71; 439/72; 439/931
[58] Field of Search ........................ 439/68, 70, 71, 72, 439/73, 78, 65, 66, 67, 525, 886, 931

[56] References Cited

U.S. PATENT DOCUMENTS

| | | | |
|---|---|---|---|
| 3,487,350 | 12/1969 | Hammell | 439/70 |
| 3,815,077 | 6/1974 | Anholt et al. | 439/70 |
| 4,084,869 | 4/1978 | Yen | 439/70 |
| 4,806,124 | 2/1989 | Bowlin | 439/931 |
| 4,902,235 | 2/1990 | Tonooka | 439/931 |

*Primary Examiner*—Larry I. Schwartz
*Assistant Examiner*—J. R. Daulton
*Attorney, Agent, or Firm*—Flehr, Hohbach, Test, Albritton & Herbert

[57] ABSTRACT

An adapter is interposed between a device having a pattern of pins projecting therefrom and a PCB having contacts connected to various components. The body of the adapter is made of platable dielectric material and is formed with holes corresponding to the pattern of pins of the device and also along one or more edges with pads corresponding in number to the holes. The holes are plated with conductive material which may be used to establish electrical contact with the pins; however, preferably clips are installed in each hole and in electrical contact therewith, the clips having converging fingers which frictionally engage the pins and also electrically contact the same. Electrically conductive traces are located on the body, each having a first end connected to the plating of a hole and a second end leading to one of the pads. The traces may be formed by a plate and etch process similar to that used in PCB fabrication. The pads of the body are plated with a material such as solder and are electrically connected to the second ends of the traces opposite the holes. The pins of the device fit into the holes of the body and the plated pads on the body are soldered to contacts on the PCB.

21 Claims, 3 Drawing Sheets

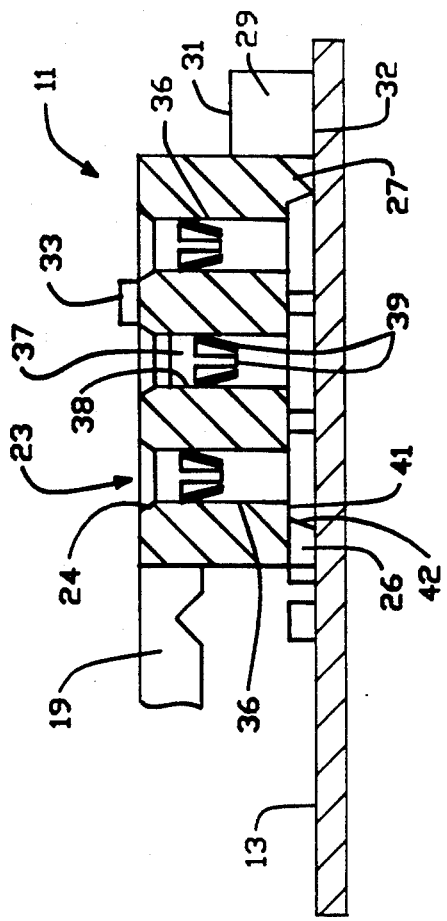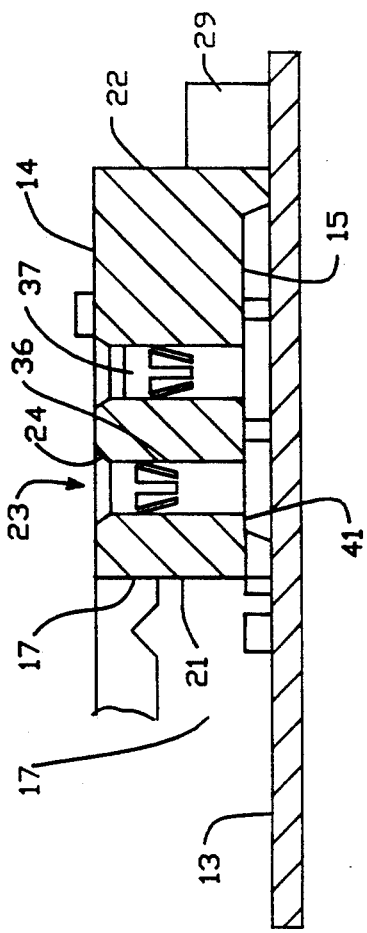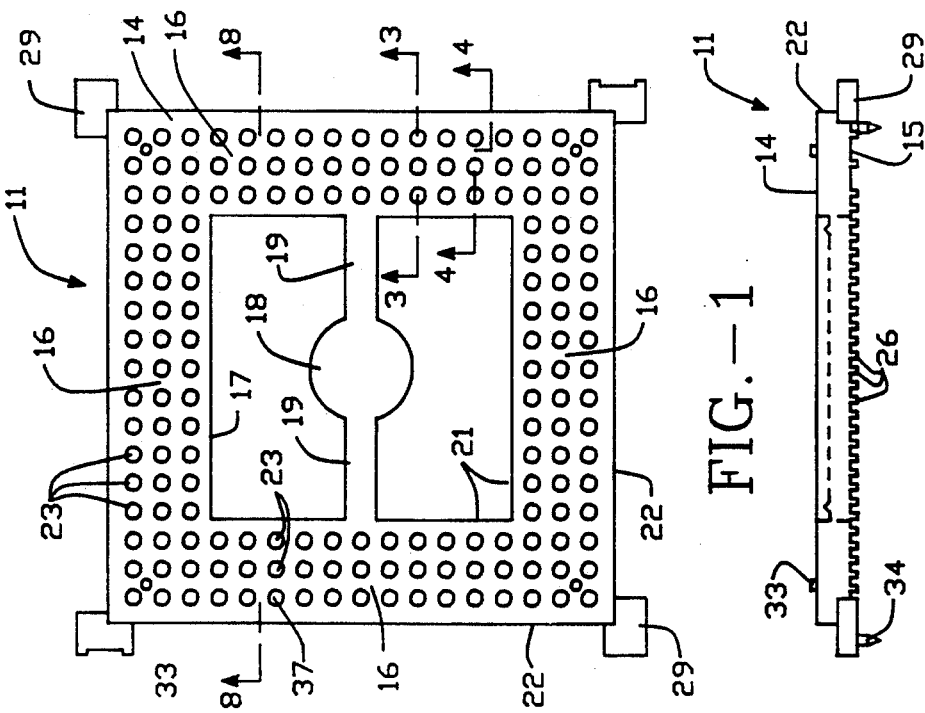

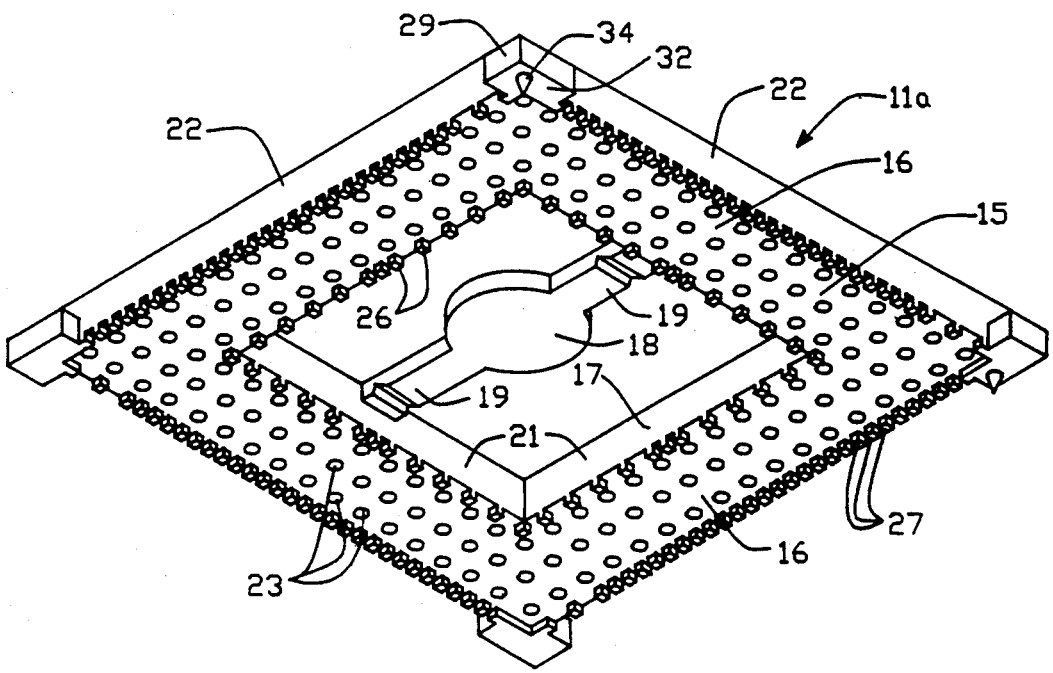
FIG.—7
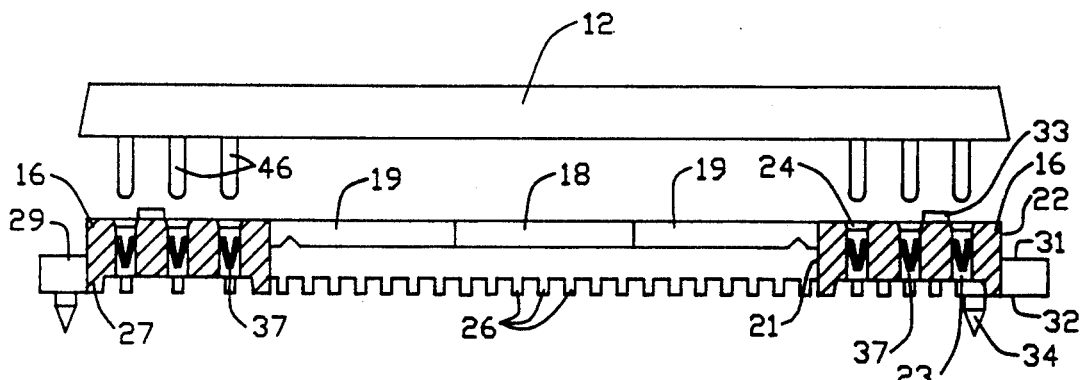
FIG.—8
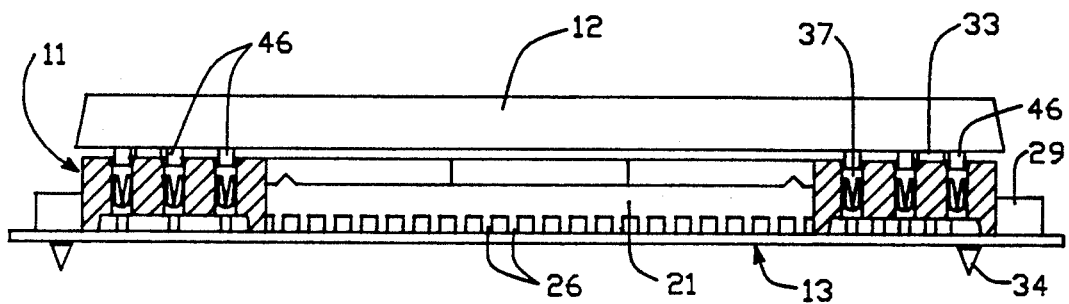
FIG.—9

INTERMEDIARY ADAPTER-CONNECTOR

This is a continuation of application Ser. No. 511,439, filed Apr. 16, 1990, now abandoned.

BACKGROUND OF THE INVENTION

1. Field of the Invention.

This invention relates to a new and improved intermediary adapter-connector to be interposed between printed circuit boards and devices such as encapsulated integrated circuit components. More particularly the invention relates to an adapter having holes to receive the pins of a device and to establish electrical contact with such pins, and electrical traces establishing electrical contact between such pins and pads located on the adapter for electrical contact with corresponding contacts or pads on a printed circuit board.

2. Description of Related Art.

Printed circuit boards (PCBs) are of two general types. The first is a plug-in type wherein devices having multiple pins plug into holes in the PCB. Electrical conductive traces interconnect the pins either with leads of other components on the board or with other electronic circuitry. This type of board has the advantage of providing quite reliable connections. The other type now becoming more common is the so-called "surface mount" PCB, wherein the pins of the devices are considerably shorter and engage pads of solder (for example) positioned on the PCB. While in general less area is required by a surface mount arrangement than would be required when a PCB of the first type is used, the connections have not been reliable. Further such connections have not made it possible to remove devices once they have been soldered in place. However, because this type conserves board space, uses of the same are preferred in many situations. The present invention has the advantage of enabling use of devices having the longer pins devised for plug-in type PCBs with surface mount PCBs.

Thus the present invention provides a bridge between surface mount and through-hole technology. Thus the user may adapt a surface mount board to use through hole type devices.

A component-carrying adapter for a chip carrier socket is disclosed in U.S. Pat. No. 4,872,844. Such an adapter has a substrate carrying one or more components which are connected by plated circuitry to comprise a member securable between a chip carrier socket and a printed circuit panel. Some of the interconnections are interrupted by dielectric material of the substrate and are blind plated holes connected to components. Post members are insertable into the blind plated holes and are matable with plated through holes of the panel. Such an adapter has different structure and function from the adapter herein described.

Various problems have arisen in the use of surface mounted PCBs which are solved by the present invention. One such problem is the matter of reliability of the electrical contact, that is, it has been difficult to inspect the contact between the pins of the socket for the device and the pads on the board. This is particularly true when there are contacts hidden by the socket or the device. In the present invention the locations of the pads are preferably at peripheral edges of the adapter so that their electrical connection to the board can be visually inspected.

SUMMARY OF THE INVENTION

The present invention comprises an adapter which accepts the through hole style contacts of conventional devices, the adapter having holes which are plated or otherwise lined with conductive material and/or provided with sleeves of conductive material to establish good electrical contact with the contacts. Electrically conductive traces are formed on the adapter leading from the holes which receive the device pins to pads located spaced around the periphery of the adapter. The pads are plated with solder or other conductive material so that they establish contact with the underlying pads on the PCB.

A further feature of the invention is the fact that the adapter is preferably formed of a nonconductive plastic which is capable of being plated. Such a plastic is a liquid crystal polymer such as Vectra C810. The interior of the holes which receive the device pins may be plated with highly conductive metals such as tin/lead over nickel. Further, the holes may be provided with tapered sleeves of a conductive material to receive the pins. Traces are formed on the adapter leading from each hole to a pad which is preferably on the periphery and the pads are made conductive by plating or other means. Thereby the pads may be electrically connected to the board as by soldering.

A further feature of the invention is a means for automating installation of the adapter on a PCB by providing a "pick and place" tab which may be contacted by a vacuum cup or other means used to lift the adapter and re-position it at the proper location on the PCB. The tab may be connected to the body of the adapter by frangible connectors so that it may be removed when not required.

Occasionally it is necessary to remove a device after it has been put in place. The use of the adapter of the present invention relieves the stress on the electrical connections of the adapter to the PCB occasioned by extraction of the device. Pads are positioned on the adapter against which the extraction tool bears, a clamp on the tool engaging the device and separating it from the adapter by pulling the pins out of the holes in the adapter. The anti-stress extraction ears are a less damaging means of removing devices than has hitherto been possible.

Another feature of the invention is the use of pads which project down from the bottom of the adapter and act as standoffs to elevate the adapter above the PCB for ease of cleaning and inspection.

Standoffs are also provided to elevate the devices from the adapter to prevent damage to the device from over-insertion.

Means are provided to ensure that the adapter is inserted in the correct orientation relative to the PCB and the pin 1 is easily identified.

The need for a second through-hole soldering operation is eliminated. The adapter can be applied to the PCB by standard methods used to mount other surface mount components.

The highly reliable multiple finger contact assures redundant electrical contact between the pins and the holes in the adapter.

The adapter is ideal for expensive ASIC applications since the sockets allow easy field upgradeability, ease in PCB testing and the addition of expensive ASIC devices just prior to shipping. Further, use of the adapter enables ASIC and other expensive devices to be added to PCB regions after such regions are subjected to surface mount fabrication, temperatures which would be deleterious to such devices, cleaning fluids, chemical damage and other hazards.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a top plan view of an adapter in accordance with the present invention.

FIG. 2 is a front elevation.

FIGS. 3 and 4 are enlarged sectional views taken along lines 3—3 and 4—4 of FIG. 1, respectively.

FIG. 7 is a view similar to FIG. 5 prior to plating.

FIG. 8 is an enlarged sectional view along the line 8—8 of FIG. 1 showing a device about to be inserted in the adapter.

FIG. 9 is a view similar to FIG. 8 showing the device inserted and the adapter applied to a PCB.

DETAILED DESCRIPTION OF THE PREFERRED EMBODIMENT

Figure 5:
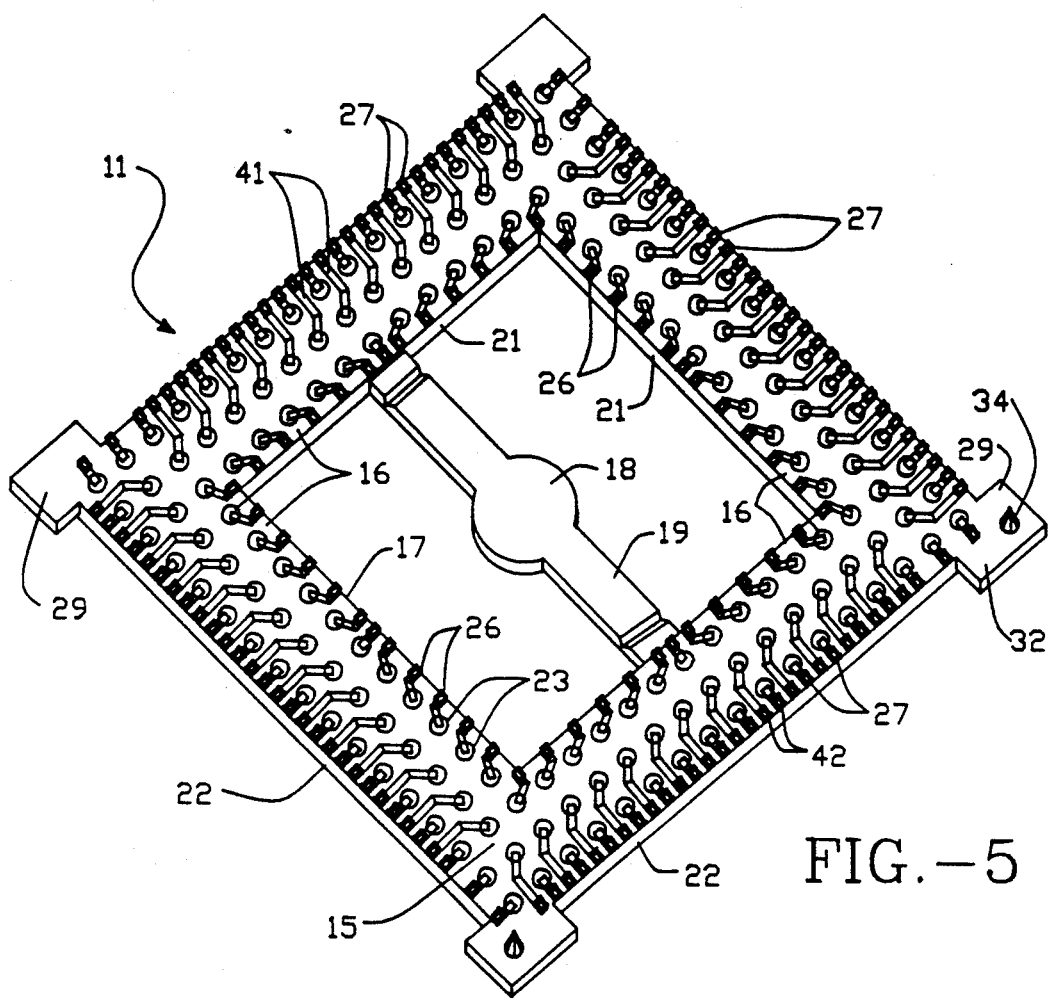
FIG. 5 is a perspective view from the bottom.
Figure 6:
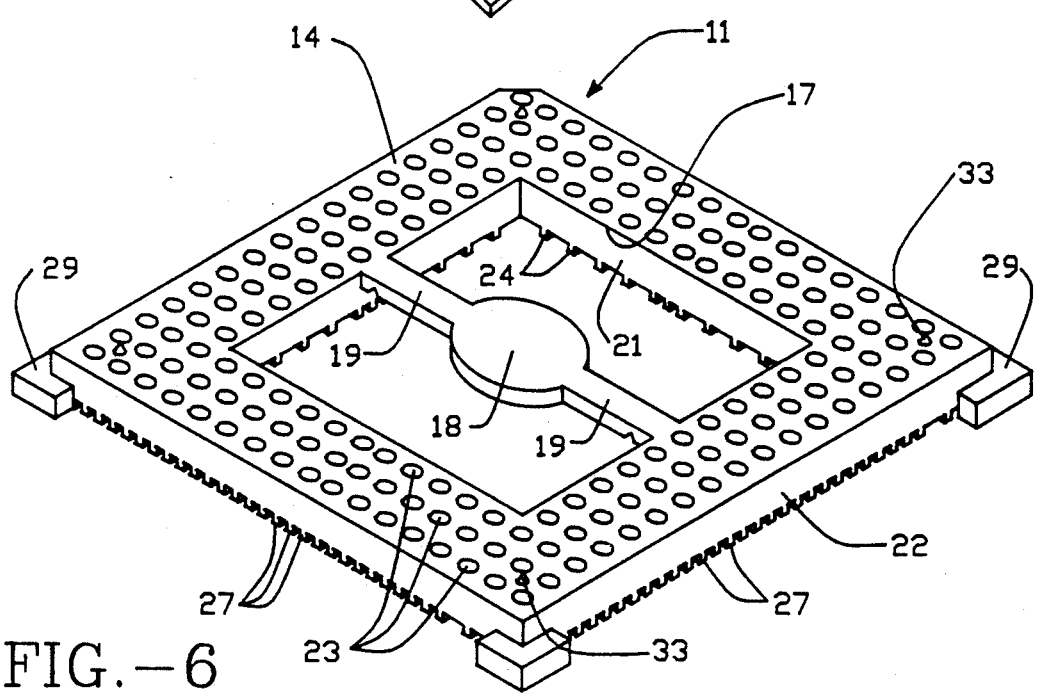
FIG. 6 is a perspective view from the top.

Reference will now be made in detail to the preferred embodiments of the invention, an example of which is illustrated in the accompanying drawings. While the invention will be described in conjunction with the preferred embodiments, it will be understood that it is not intended to limit the invention to those embodiments. On the contrary, the invention is intended to cover alternatives, modifications and equivalents, which may be included within the spirit and scope of the invention as defined by the appended claims.

Intermediary adapter connector body 11 is interposed between a device 12 which may be an encapsulated integrated circuit chip or component and a printed circuit board 13 (see FIGS. 8 and 9). The adapter 11 is formed of a non-conductive plastic which may be plated. One suitable insulator material is a liquid crystal polymer Vectra C810 having a heat deflection temperature of 210° C. The body 11 has a top surface 14 and a bottom surface 15 and preferably has four sides 16 around a central opening or hollow 17 i.e., defines a closed path geometric shape having a central opening. A pick and place tab 18 is disposed in the center of the opening 17 and connected to two of the sides 16 by arms 19. Arms 19 may be frangible so that the tab 18 and arms 19 may be removed when not required. Thus, each is connected with a weakened section 20 to the remainder of the body 11.

Thus the body 11 has interior edges 21 and exterior edges 22. It will be understood that although the accompanying drawings show a generally square shaped body 11, the body may be made in other shapes. A feature of body 11 is the formation therein of holes 23 to receive the pins 46 of device 12, as hereinafter appears. To assist in insertion of pins 46, the upper ends of holes 23 are preferably formed with countersinks 24. In the accompanying drawings there are three rows of holes 23 but it will be understood that the number of such holes is subject to variation. The spacing between holes 23 correspond to the spacing between the pins 46 of devices 12.

As best shown in FIGS. 2, 5 and 7, a plurality of surface mounted leads or pads 26 are located spaced at intervals adjacent to the interior edges 21 and similar leads 27 are formed adjacent the exterior edges 22. At the corners there are ears 29 having top surfaces 31 depressed below the level of top surface 14 and bottom surfaces 32 depressed below the bottom surface 15 and co-planar with the lower edges of leads 26, 27 (See FIG. 8). As best shown in FIG. 2, standoffs 33 may be formed projecting up from top surface 14 to space the device 12 above the level of the adapter 11. Furthermore, pins 34 which are downward tapering, fit through holes in the PCB (See FIG. 9) to locate the adapter and also to orient it relative to the PCB.

Adapter 11 is formed of a dielectric material which may be plated and accordingly the walls of each of the holes 23 is plated preferably with an underlayer of about 500 micro-inches of nickel and a layer of 500 micro-inches of tin/lead. The function of the plating 36 is to provide electrical contact for the pins 46 of the device 12, as hereinafter appears. Socket-like conductor clips 37 are installed in holes 23 having cylindrical upper ends 38 which firmly engage the plating 36 on the walls of holes 23 and having at their lower ends inward tapered fingers 39 which frictionally engage the pins 46. Other style clips may be used.

By means hereinafter described, electrically conductive traces 41 are formed, preferably upon bottom surface 15, extending from the plating 36 of each hole 23 to a corresponding lead 26 or 27. The electrically conductive traces 41 are preferably of copper or other suitable conductive material. Plating 42, preferably of an antimony lead alloy over nickel, covers each lead 26 and 27.

In use of the adapter 11, the pins 46 of device 12 are inserted through the countersinks 24 of holes 23, so that the position of FIG. 9 is attained. The conductor clips 37 establish connection with the pins 46 and the conductor clips 37 are in electrical contact with the plating 36. Traces 41 connect the plating 36 with the plating 42 over the leads 26,27. The leads 26,27 engage pads (not shown) on the PCB 13.

It will thus be seen that the adapter is surface mounted on the board 13 and that the leads 26,27 are spaced apart and can be readily observed for inspection. Pins 34 are polarizing pins and ensure proper orientation of the adapter 11 relative to the PCB 13 and proper placement of the adapter on the board.

The adapter 11 may be picked up from a work station and deposited at another station or on a PCB 13 by an automatic device which engages the tab 18. For example, a vacuum cup may engage the tab 18 and by appropriate mechanism (transport means) lift the adapter 11 and move it to the desired location. After connecting adapter 11 to board 13, tab 18 may be removed if desired for additional center clearance.

Occasionally it is necessary to remove a device 12. Removing a device 12 mounted directly on a board 13 or from a conventional socket may damage the board or the electrical connection to the adapter. In accordance with the present invention, an extractor tool may be used which bears against the tops 31 of ears 29 and has a clamp to engage the device 12 and lift it vertically upward relative to the adapter 11, the pins 46 pulling out of the holes 23.

Various means may be used to form the traces 41. One preferred means is a plate and etch process using additive plating and screened, pad-printed or photo-printed imaging techniques as well understood in the printed circuit board industry. Thus the adapter bottom surface 15 may be coated with an adhesion promoting chemical. Thereupon the bottom surface is plated with additive copper or other suitable conductor. An etching resisting material is then applied in a pattern to the copper by well known imaging equipment for photoexposure, screen and pad printing, ultra violet and thermal curing. The copper between the etch resist deposits is then etched away and the etch resist is stripped. The resultant deposit on the bottom surface 15 comprises the traces 41.

It will be understood that traces for connecting devices to holes 23 may be formed on both top and bottom surfaces 15,14 to allow connection of various components such as resistors and capacitors forming an integral part of the adapter.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. For example, it is contemplated that passive or active electrical components for a desired electrical circuitry configuration could be incorporated directly into the body of an adapter of the invention. The embodiments described were chosen in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An adapter for electrically connecting pins of an electrical circuit device with a surface mount printed circuit board, comprising a dielectric body defining a bottom surface to be adjacent said printed circuit board when said adapter is connected with the same, which body is formed with a pattern of holes opening at said bottom surface adapted to mate with a corresponding pattern of pins of a device with at least some of said holes terminating at said bottom surface at a location remote from an edge of said surface,
   first means in each of said holes to form an electrical connection with a corresponding one of said pins,
   a plurality of second means on said bottom surface of said body remote from said holes adapted to form an electrical connection with contacts of a PCB, and
   third means having a lead on said bottom surface electrically connecting each of said first means with a corresponding one of said second means.

2. An adapter according to claim 1 in which said body has a plurality of external edges and said second means are positioned adjacent at least one of said external edges.

3. An adapter according to claim 1 in which said body when viewed in plan is a closed path geometric shape, having at least one internal edge and said second means are positioned adjacent at least one of said internal edges.

4. An adapter according to claim 1 in which said second means comprises a plurality of conductive pads on a surface of said body.

5. An adapter according to claim 1 in which said body has a top surface and which further comprises a standoff extending above said top surface adapted to locate a device spaced above said top surface.

6. An adapter according to claim 1 in which said body has a bottom surface and which further comprises a tapered pin extending below said bottom surface adapted to fit into a hole in a PCB to locate said adapter relative to said PCB.

7. In combination, an adapter according to claim 1, and a device having pins fitting into said holes and in electrical connection with said first means,
   and a PCB having contacts, said second means being in electrical contact with said contacts.

8. An adapter according to claim 1 in which said hole pattern includes a set of holes having other holes between said holes of said set and said one edge of said body, and said third means includes electrical traces extending from each hole of said set to adjacent said edge.

9. An adapter according to claim 1 in which said body is formed of a platable material and in which
   said first means comprises plating within each said hole and said third means connects to said plating.

10. An adapter according to claim 9 in which said first means comprises conductive clips within said holes to frictionally and electrically engage pins inserted in said holes.

11. An adapter according to claim 1 in which said third means comprises said bottom plurality of electrically conductive traces deposited on a surface of said body.

12. An adapter according to claim 11 in which said traces are plated on said body.

13. An adapter according to claim 1 which further comprises tap means frangibly connected via a weakened section to the remainder of said body for removal therefrom, said tab means being configured to be contacted by external means for attachment to a transport means for moving said adapter to a different location.

14. An adapter according to claim 13 in which said body defines a closed path geometric shape having a central opening annular in shape when viewed in plan and said tab is positioned in said opening.

15. An adapter according to claim 13 wherein said tab is frangibly connected to said body for removal therefrom.

16. An adapter according to claim 1 in which said body is formed with ear means positioned for engagement by an extraction tool to extract a device from said adapter.

17. An adapter according to claim 16 wherein said ear means have bottom ear surfaces below said bottom surface of said body and are substantially coplanar with the bottom surfaces of said second means.

18. An adapter comprising a dielectric body formed with a pattern of holes adapted to mate with a corresponding pattern of pins of an electrical circuit device;
   first means in each said hole to form an electrical connection with a corresponding one of said pins;
   a plurality of second means on said body remote from said holes adapted to form an electrical connection with contacts of a PCB;
   third means electrically connecting each of said first means with a corresponding one of said second means; and
   tab means frangibly connected via a weakened section to the remainder of said body for removal therefrom, said tab means being configured to be contacted by external means for attachment to a transport means for moving said adapter to a different location.

19. An adapter comprising a dielectric body formed with a pattern of holes adapted to mate with a corresponding pattern of pins of an electrical circuit device;
   first means in each said hole to form an electrical connection with a corresponding one of said pins;
   a plurality of second means on said body remote from said holes adapted to form an electrical connection with contacts of a PCB;
   third means electrically connecting each of said first means with a corresponding one of said second means; and
   means positioned ears on said body for engagement by an extraction tool to extract pins of an electrical circuit device from holes of said adapter.

20. An adapter according to claim 19 wherein said body has top and bottom body surfaces and said ear means is a plurality of ears positioned on said body with coplanar top and bottom ear surfaces, said bottom ear surfaces being below said bottom body surface and substantially coplanar with the portion of said second means adapted to form an electrical connection with contacts of a PCB.

21. An adapter comprising:
   a dielectric body formed both with a pattern of holes adapted to mate with a corresponding pattern of pins of an electrical circuit device and a plurality of non-conductive pads for forming a connection with contacts of a surface mount printed circuit board;
   first means in each said hole to form an electrical connection with a corresponding one of said pins;
   a plating of a conductive material on a plurality of said pads to make said plurality coplanar with one another and electrically conducting relative to corresponding contacts of a surface mount printed circuit board; and
   third means electrically connecting each of said first means with a corresponding one of said pads.

* * * * *